United States Patent [19]
Uda

[11] Patent Number: 5,247,652
[45] Date of Patent: Sep. 21, 1993

[54] PARALLEL TO SERIAL CONVERTER ENABLING OPERATION AT A HIGH BIT RATE WITH SLOW COMPONENTS BY LATCHING SETS OF PULSES FOLLOWING SEQUENTIAL DELAYS EQUAL TO CLOCK PERIOD

[75] Inventor: Yoshihiro Uda, Tokyo, Japan

[73] Assignee: NEC Corporation, Japan

[21] Appl. No.: 515,862

[22] Filed: Apr. 27, 1990

[30] Foreign Application Priority Data

Apr. 27, 1989 [JP] Japan ................ 1-49871[U]

[51] Int. Cl.[5] .............. G06F 5/00; G06F 5/01; G06F 5/06; G06F 1/04
[52] U.S. Cl. ................................ 395/500; 395/250; 395/550; 341/101; 364/239.1; 364/239.2; 364/270; 364/271.5; 364/DIG. 1
[58] Field of Search ............ 341/101, 106, 847; 395/425, 500, 550, 250; 364/101, 100

[56] References Cited

U.S. PATENT DOCUMENTS

| | | | |
|---|---|---|---|
| 4,209,771 | 6/1980 | Miyata et al. | 340/347 |
| 4,377,806 | 3/1983 | Elliott et al. | 340/347 |
| 4,674,064 | 6/1987 | Vaughn | 395/500 |
| 4,759,042 | 7/1988 | Humpleman | 377/75 |
| 4,885,584 | 12/1989 | Dalrymple | 341/101 |
| 4,901,076 | 2/1990 | Askin et al. | 341/100 |
| 4,954,826 | 9/1990 | Isozaki et al. | 341/100 |
| 4,958,349 | 9/1990 | Tanner et al. | 371/37.1 |
| 4,961,621 | 10/1990 | Su | 350/96.16 |
| 4,961,739 | 10/1990 | Thompson | 606/37 |
| 5,056,012 | 10/1991 | Spiotta et al. | 395/425 |

Primary Examiner—Lawrence E. Anderson
Assistant Examiner—Alpesh M. Shah
Attorney, Agent, or Firm—Ostrolenk, Faber, Gerb & Soffen

[57] ABSTRACT

A parallel to serial converter for convering incoming parallel, byte sized, data supplied at a first data rate to single bit serial data includes a shift register in which several bytes of the incoming data are stored simultaneously and thereafter serially transmitted therefrom. The parallel to serial converter includes latching devices in which the incoming data bytes are stored prior to being transferred to the shift register. Since successively arriving bytes of data are stored in successively selected ones of the latching devices, the data rate (device speed) of the latches is permitted to be only a fraction of the first data rate associated with the incoming bytes of data resulting in a fast, yet inexpensive, circuit.

4 Claims, 4 Drawing Sheets

PARALLEL TO SERIAL CONVERTER ENABLING OPERATION AT A HIGH BIT RATE WITH SLOW COMPONENTS BY LATCHING SETS OF PULSES FOLLOWING SEQUENTIAL DELAYS EQUAL TO CLOCK PERIOD

BACKGROUND OF THE INVENTION

This invention relates to an improvement for a a parallel/serial converter which converts parallel signal sequence into a serial signal sequence.

A parallel/serial converter of this type has been used for an interface which converts parallel data from a computer or a communication system to serial data and a multiplexer which multiplexes a plurality of data sequences from plural channels.

A prior art parallel/serial converter comprises a parallel input/serial output shift register and a holding register connected to the parallel input side of the shift register as a buffer store means. (See, for example, pages 4–9 of "Technical Aspects of Data Communication" (in Japanese) published by CQ Publishing Company, on Apr. 20, 1980). The holding register loads and stores n-bit (n is an integer) parallel input digital data with a load input, and then the shift register receives the stored data in parallel from the holding register to shift n-bit serial signal on a bit by bit basis with a shift clock signal which has a higher rate than the input digital data. When the shift register has shifted out the n-bit serial data, it receives the next n-bit parallel outputs from the holding register and then converts them to serial data. If the signal rate of the parallel input signal sequence increases, the store means should receive and store each of the parallel input signals at a rate proportionally higher. Therefore, the prior art parallel/serial converter can not operate at the signal rate beyond the capacity of the operational frequency of the holding register and the latch circuit.

SUMMARY OF THE INVENTION

It is an object of this invention to provide a parallel/serial converter which permits operation at a higher bit rate despite the use of components usable at a reduced bit rate.

The parallel/serial converter according to this invention converts n (n being an integer) bit parallel data streams into a serial data stream.

The parallel/serial converter comprises: first latch means responsive to a first timing pulse for latching the n bit parallel data streams to produce first n bit parallel data streams; m (m being an integer) second latch means responsive to m second timing pulses for latching the n bit parallel data streams to produce m sets of second n bit parallel data streams; third latch means responsive to the first timing pulse for latching the m sets of second n bit parallel data streams to produce m sets of third n bit parallel data streams; shift register means coupled to the first and third latch means and responsive to the first n bit parallel data streams and the m sets of third n bit parallel data streams and a load pulse for registering $(m+1) \times n$ bit data from the first n and m sets of third n parallel data streams and for shifting the $(m+1) \times n$ bit data in response to a shift pulse; and timing generating means for generating the first timing pulse, m second timing pulses, the load pulse, and the shift pulse. The first timing pulse have one-$((m+1) \times n)$th of the clock rate of the shift clock pulse, and each of the m second timing pulses is delayed by one-m th of a period of the first timing pulse. The load pulse is timed with the first timing pulse.

BRIEF DESCRIPTION OF THE DRAWINGS

The present invention will be better understood from the following detailed description taken in conjunction with the accompanying drawings in which.

DETAILED DESCRIPTION OF THE PREFERRED EMBODIMENTS

Figure 1:
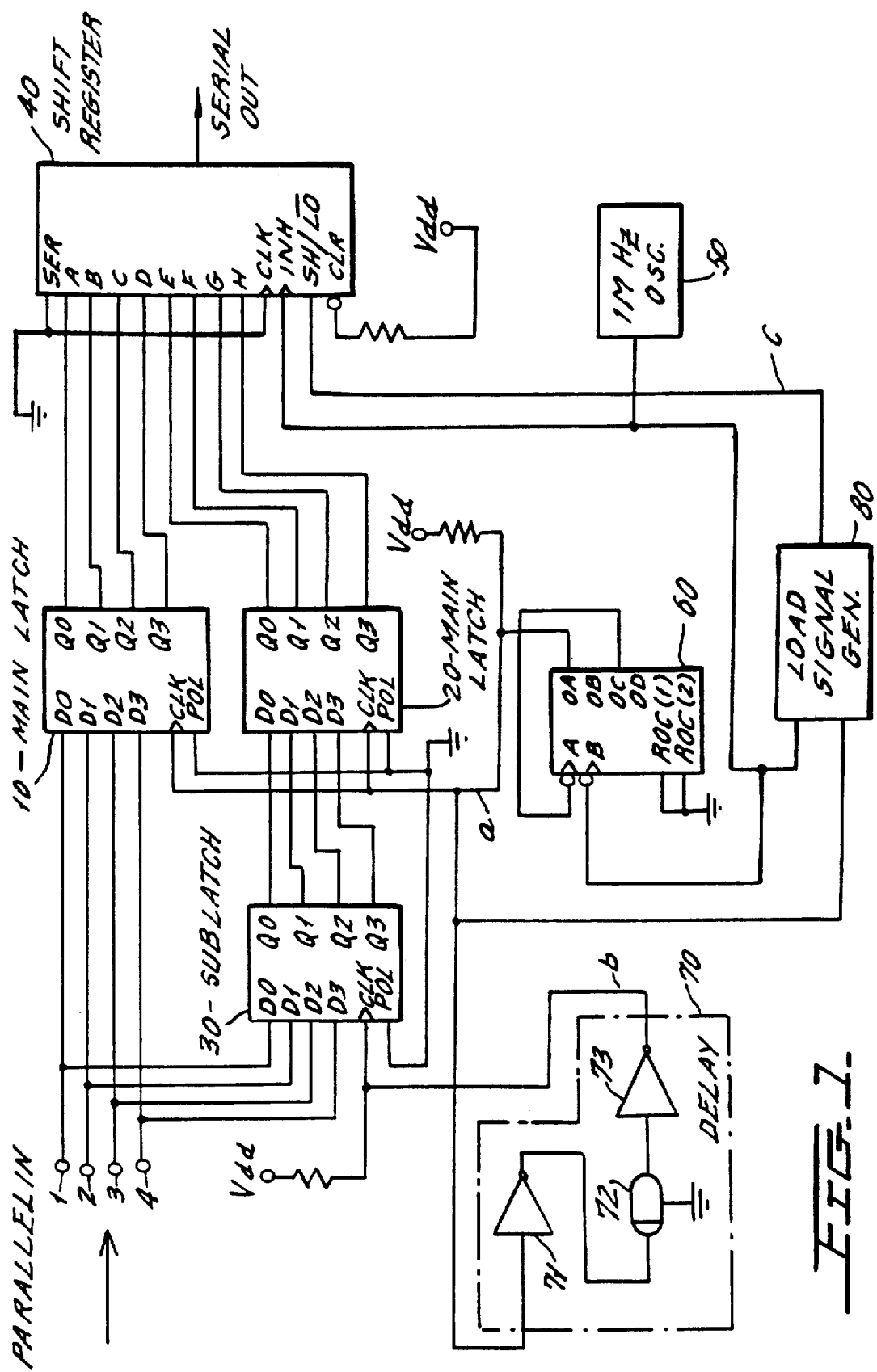
FIG. 1 is a block diagram showing a first embodiment of the parallel/serial converter according to this invention.

As shown in FIG. 1, a parallel/serial converter of this invention comprises a first main latch circuit 10 and a sub-latch circuit 30 which alternately latch 4-bit parallel input digital data streams applied at input terminals 1, 2, 3 and 4 at a constant interval, a second latch circuit 20 which latches the parallel outputs from the sub-latch circuit 30 (simultaneously with the first latch circuit 10), and a parallel input/serial output shift register 40 which converts 8-bit parallel outputs from the first and second latch circuits 10, 20 into a serial data stream.

Figure 2:
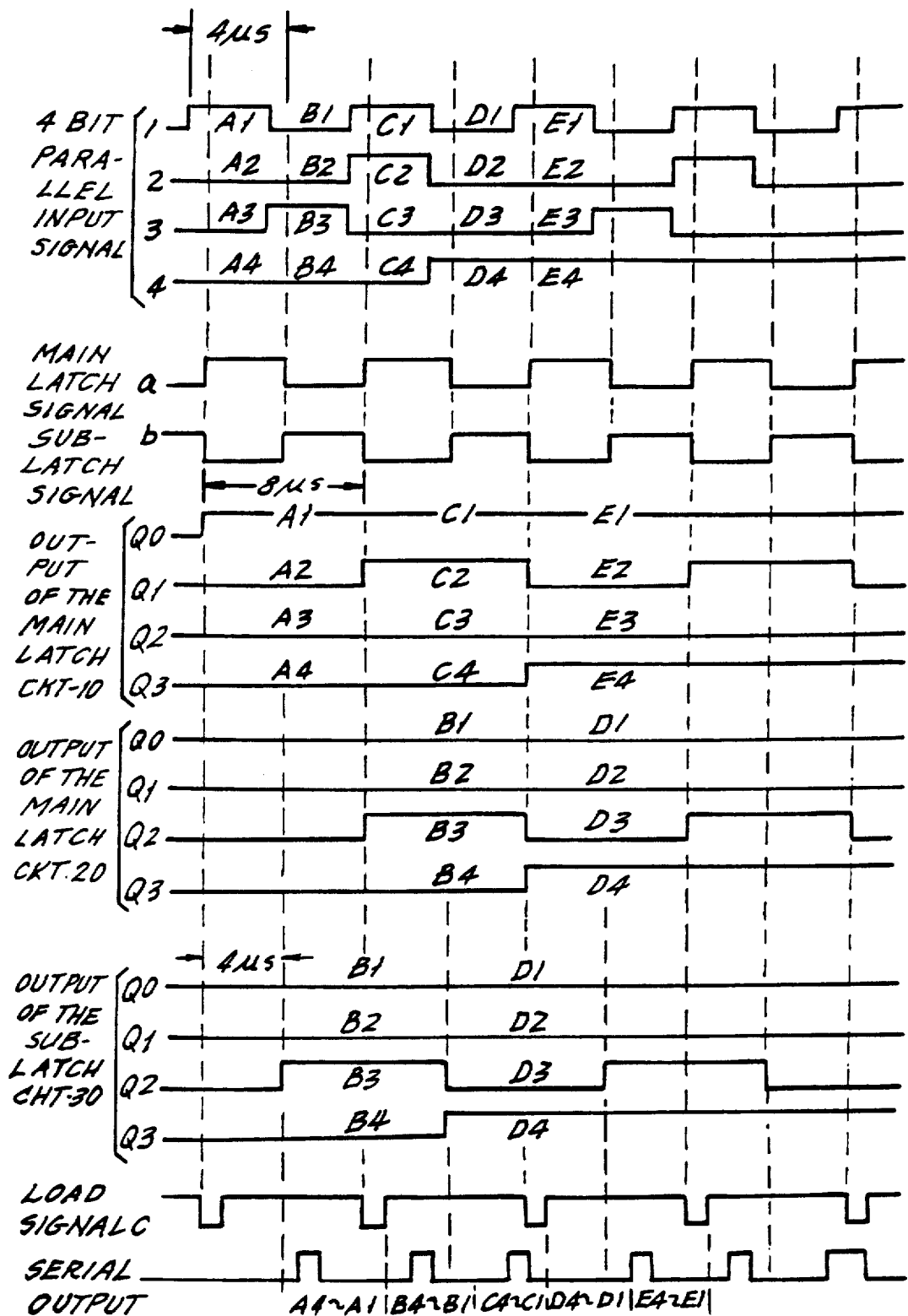
FIG. 2 is a timing chart shows the operation of the parallel/serial converter of FIG. 1.

The 4-bit parallel input signal applied to the input terminals 1, 2, 3 and 4 may be parallel data such as characters or independent data streams for each of the input terminals. As shown in FIG. 2, 4-bit parallel input signals A1–A4, B1–B4, C1–C4, D1–D4, and E1–E4 (Each of Ai, Bi, Ci, Di, Ei (i=1~4) indicates a 1-bit signal in 4-bit parallel data) are continuously supplied at input terminals 1, 2, 3 and 4 every 4 μs, and stored alternately in the main latch circuit 10 and in the the sub-latch circuit 30. The main latch circuit 10 and the sub-latch circuit 30 latch parallel inputs repeatedly, each one every 8μ seconds or two times longer than the latching period of the parallel input signals. The main latch circuit 10 latches and stores the parallel input signals A1–A4, C1–C4 and E1–E4 every 8 μs, while the sub-latch circuit 30 latches and stores the parallel input signals B1–B4 and D1–D4 during a period of 8 μs which is delayed by 4 μs that of the main latch circuit 10. The parallel input signals which are stored in the sub-latch circuit 30 are further latched by the main latch circuit 20 simultaneously with the main latch circuit 10.

The latching operation of the main latch circuits 10 and 20 and the sub-latch circuit 30 is controlled by an oscillator 50, a # frequency divider 60 and a delay circuit 70. The oscillator 50 generates a 1 MHz clock signal frequency which is divided by the ⅛ frequency divider 60, obtaining a main latch signal a of 125 KHz (with the period of 8 μs). The main latch signal a is supplied to both the main latch circuits 10 and 20. As shown in FIG. 2, the main latch signal a is set to have a rising edge when the parallel input signal level is stable. The main latch signal a is delayed by 4 μs by the delay circuit 70 and supplied to the sub-latch circuit 30 as a sub-latch signal b. The delay circuit 70 comprises a delay line 72 which is serially connected between inverter gates 71 and 73 which shape the waveform of the signal.

The main latch circuits 10 and 20 and the sub-latch circuit 30 are designed to latch parallel input signals at the rising edges of the main latch signal a and the sub-latch signal b, respectively, and output and hold these signals at terminals Q0-Q4 until the next latch time. After the parallel signals A1-A4 are latched and stored by the main latch circuit 10, the main latch circuits 10 and 20 latch parallel signals C1-C4 and B1-B4, and further 8 μs later, latch paralel signals E1-E4 and D1-D4. The 8-bit parallel outputs from the main latch circuits 10 and 20 are respectively applied to the input terminals A-H of the parallel input/serial output shift register 40 and loaded at the shift register 40 with a load signal c which is generated immediately after the rise of the main latch signal a. The load signal c is the pulse signal of negative logic supplied from a load signal generator 80, and turns to low level in synchronization with the rise of the main latch signal a and to high level after 1μ second (equivalent to one period of the clock signal from the oscillator 50). The shift register 40 loads the parallel outputs from the main latch circuits 10 and 20 at the rising edge of load signal c, and shifts out the loaded 8-bit parallel signal on a bit by bit basis with the clock signal from the oscillator 50, in the order of the parallel inputs at the input terminals H, G, F, E, D, C, B, and A. Therefore, the parallel signals A1-A4, B1-B4 and C1-C4 are converted into serial signal sequence A4, A3, A2, A1, B4, B3, B2, B1, C4, C3, C2, C1.

As the latching period at the latch circuits 10, 20 and 30 in the aforementioned embodiment is two times higher than the input period of the parallel input signal sequence at the input terminal 1, 2, 3 and 4, the latch circuits 10, 20 and 30 can use slower ICs which need operate at only one half of the speed of prior art ICs.

Figure 3:
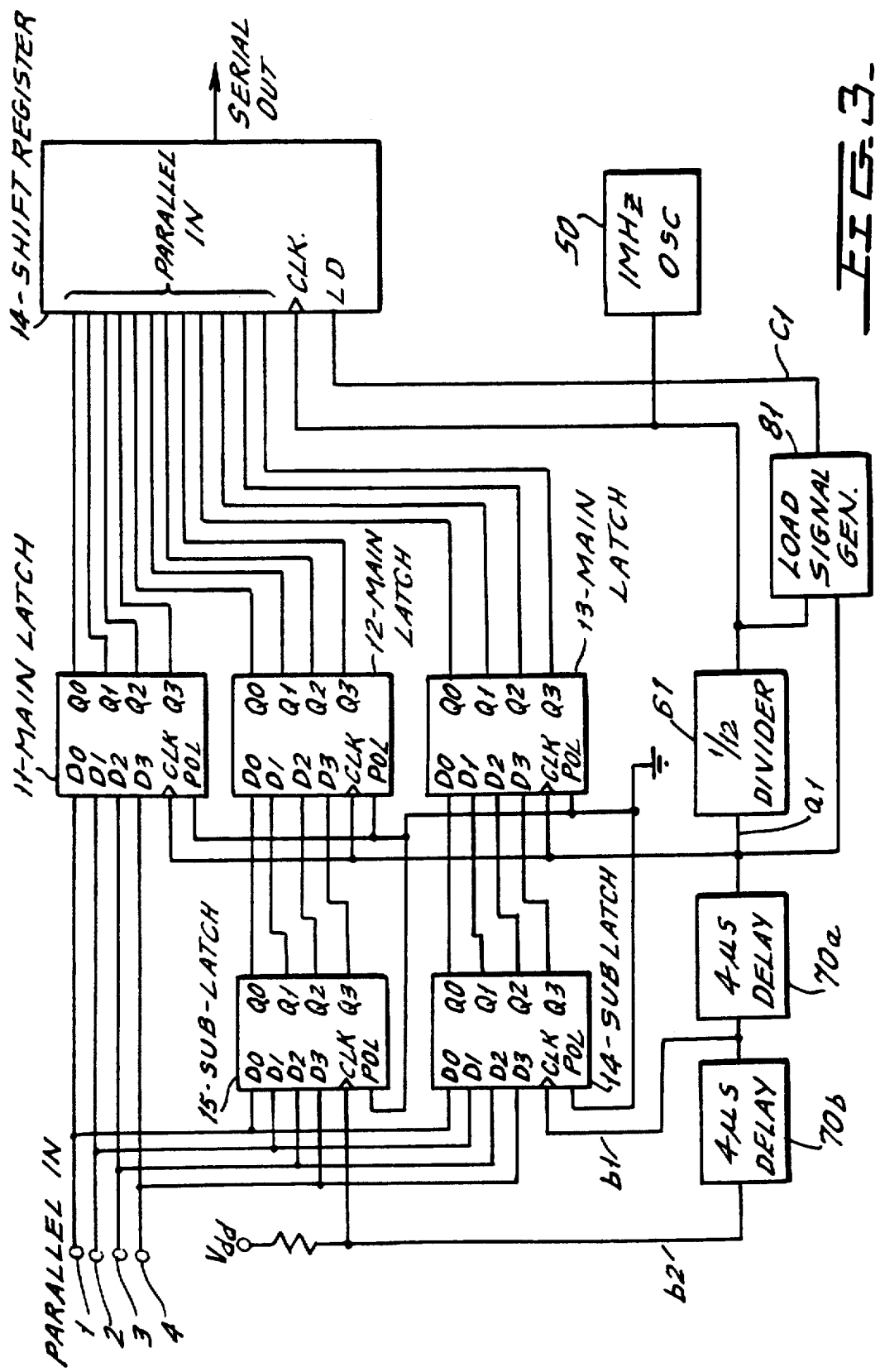
FIG. 3 is a block diagram showing a second embodiment of this invention.

FIG. 3 shows another embodiment of the present invention's converter in block diagram. In FIG. 3, the parallel/serial converter comprises first, second and third main latch circuits 11, 12 and 13 and first and second sub-latch circuits 14, 15 which can use ICs operating at the rate lower thean the latch circuits 10, 20 and 30 of the first embodiment. A parallel input/serial output shift register 41 shifts the 12-bit parallel data fed from the main latch circuits 11, 12 and 13 and converts the same to a serial data sequence.

Figure 4:
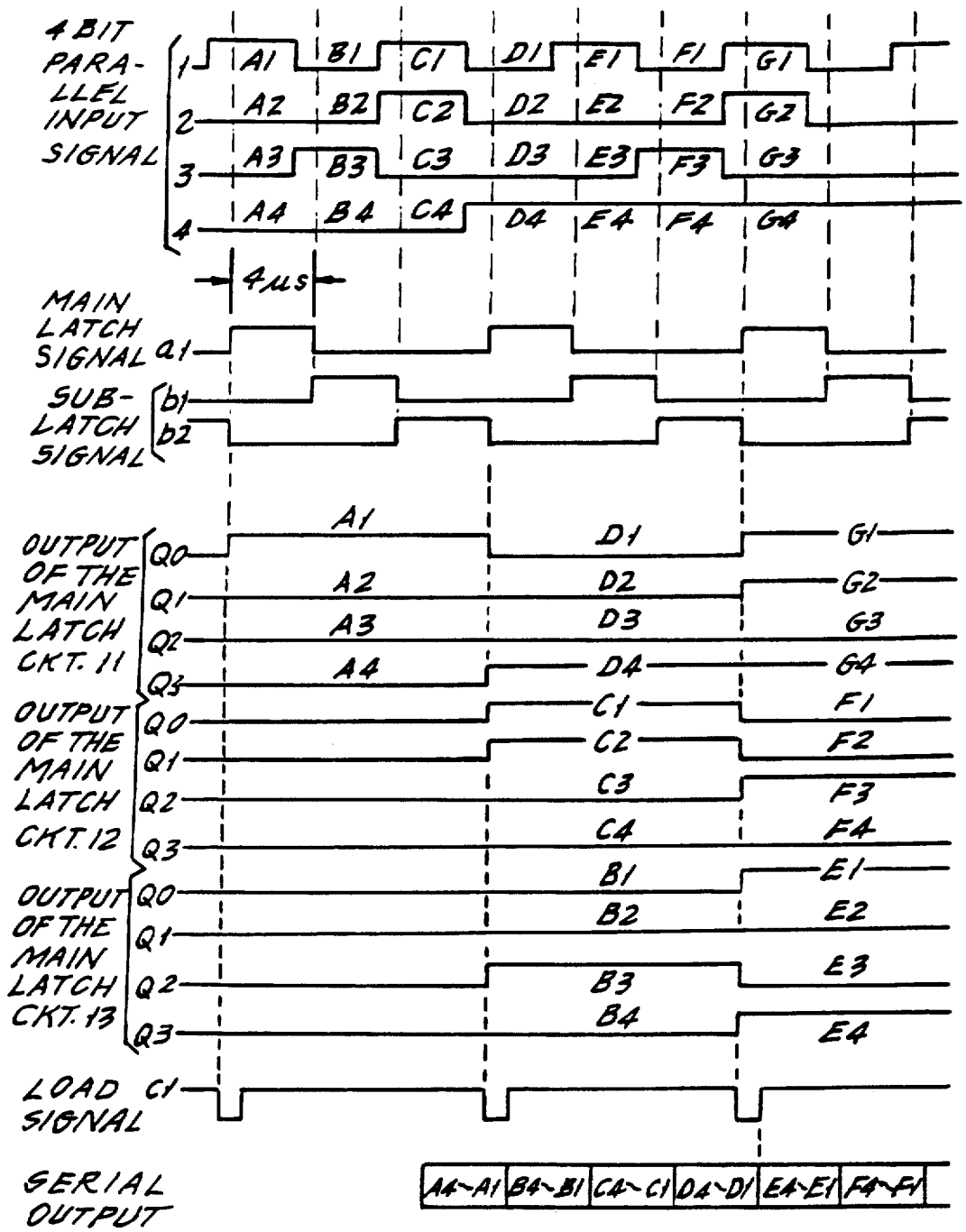
FIG. 4 is a timing chart showing the operation of the parallel/serial converter of FIG. 3.

Similarly to the parallel input signals shown in FIG. 2, 4-bit parallel input digital signals A1-A4, B1-B4, ... are continuously supplied to input terminals 1, 2, 3 and 4, every 4 μs as shown in FIG. 4. The first latch circuit 11 and the first and second sub-latch circuits 14, 15 are connected to the input terminals 1, 2, 3 and 4. The first main latch circuit 11 latches the first parallel input signals A1-A4 at the rising edge of the main latch signal a1 which has a period of 12 μs. The main latch signal a1 is a clock signal having period of 12 μs which is obtained by dividing the frequency of the clock signal of 1 MHz from the oscillator 50 by 12. Then, the first sub-latch circuit 14 latches parallel input signals B1-B4 at the rising edge of a first sub-latch signal b1 which is obtained by delaying the main latch signal a1 by 4 μs at the delay circuit 70a. The second sub-latch circuit 15 latches parallel input signals C1-C4 at the rise of a second sub-latch signal b2 obtained by delaying the first sub-latch signal b1 by 4 μs at the delay circuit 70b. The parallel input signals which have been latched at the main latch circuit 11 and sub-latch circuits 14, 15 are stored and outputted so that they held until next rising edges of the respective latch signals a1, b1, b2. The 4-bit parallel outputs from the first sub-latch circuit 14 are latched by the third main latch circuit 13 at the rising edge of the main latch signal a1 while the 4-bit parallel outputs from the second sub-latch circuit 15 are latched by the second latch circuit 12 at the rising edge of the main latch signal a1.

When the main latch circuit 11 latches parallel input signals A1-A4, the main latch circuits 12, 13 do not latch any signals because the sub-latch circuits 14, 15 have not stored the parallel signal respectively. But when the main latch circuit 11 latches parallel input signals D1-D4, the main latch circuits 12, 13 latch respectively the parallel inputs C1-C4 and B1-B4 which have been stored by the sub-latch circuits 15 and 14. Therefore, the main latch circuits 11, 12 and 13 output parallel input signals D1-D4, C1-C4, and B1-B4 to the shift register 41 for the period of 12 μs after the main latch circuit 11 has outputted parallel signals A1-A4.

The shift register 41 loads 12-bit parallel signals from the main latch circuits 11, 12 and 13 at the rising edge of load signal c1 which is generated immediately after the rising edge of the main latch signal a1, and shifts them out bit by bit with the 1 MHz clock of the oscillator. The shift register 41 converts the 12-bit parallel signals into a serial signal every 12 μs. The load signal c1 is a pulse signal of negative logic generated from a load signal generator 81 which assumes a low level at the rising edge of the main latch signal a1 and a high level after one clock period from the oscillator.

The parallel/serial converter shown in FIG. 3 can use a latch circuit of a speed lower than that used for the converter shown in FIG. 1. For permitting the use of latches operable at a further reduced bit rate, additional sub-latch circuit and main latch circuit may be connected in parallel between input terminals and a shift register to increase the number of parallel inputs of the shift register as well as to increase the latch period proportionally to the number of the main latch circuits.

Although two to three 4-bit latch circuits are connected in parallel to the main latch circuit in the parallel/serial converters shown in FIGS. 1 and 3, only one latch circuit of 8-bit or 12-bit may be used instead.

As described in detail above, this invention provides a sub-latch means which latches parallel input signals different from those in the first latch means, and a second main latch which latches the parallel inputs stored in the sub-latch means simultaneously with the first main latch means, and the first and second main latch means supply plural parallel outputs of the rate lower than the original parallel input signals to a parallel input/serial output shift register. Therefore, the operational frequencies of respective latch means are reduced in proportion to the number of the parallel inputs to the shift register, and the main and sub-latch means can use low rate ICs, even if the parallel input signals have a higher rate.

What is claimed is:

1. A parallel to serial converter for converting n bit (n being an integer) parallel input data provided on n bit data lines at a main clock rate into a serial data stream, said parallel to serial converter comprising:

first latch means connected to said n bit data lines and responsive to first timing pulses for latching said n bit parallel input data to produce first n bit parallel data, said first timing pulses having a clock rate one/(m+1)th of said main clock rate;

second latch means comprising m (m being an integer greater than one) latches connected to said n bit data lines for latching in parallel said n bit parallel input data one after another in response to m sets of second timing pulses, each of said second timing pulses having a clock rate one/(m+1)th of said main clock rate and said first timing pulses and successive ones of said second timing pulses being delayed relative to each other by one clock period of said main clock rate to produce m sets of second n bit parallel data, said first timing pulses and said m sets of second timing pulses being sequentially supplied to said first and second latch means respectively;

third latch means responsive to said first timing pulses for latching said m sets of second n bit parallel data to produce third n×m bit parallel data;

shift register means coupled to said first and third latch means and responsive to said first n bit parallel data and said third n×m bit parallel data for registering said first and third parallel data and for shifting said first and third data in response to shift pulses; and timing generating means for generating said first timing pulses, m sets of second timing pulses and said shift pulses, said shift pulses having a pulse rate which permits serial shifting of said first and third data from said shift register within a period corresponding to a repetition rate of said first timing pulses.

2. The parallel to serial converter of claim 1, wherein said timing generator means is further effective for generating a load pulse for loading into said shift register means said first n bit and third n×m bit parallel data, said load pulse being timed with said first timing pulses.

3. The parallel to serial converter to claim 1, wherein said timing generating means comprises an oscillator for producing said shift pulses, and clock divider means for producing said first and second timing pulses from an output of said oscillator.

4. The parallel to serial converter of claim 3, further comprising delay circuit means for delaying said second timing pulses relative to said first timing pulses.

* * * * *